(12) United States Patent
Kim

(10) Patent No.: US 7,772,626 B2
(45) Date of Patent: Aug. 10, 2010

(54) IMAGE SENSOR AND FABRICATING METHOD THEREOF

(75) Inventor: Sung-Moo Kim, Eumseong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 157 days.

(21) Appl. No.: 12/271,887

(22) Filed: Nov. 15, 2008

(65) Prior Publication Data

US 2009/0127600 A1 May 21, 2009

(30) Foreign Application Priority Data

Nov. 19, 2007 (KR) .................. 10-2007-0117990

(51) Int. Cl.
*H01L 31/112* (2006.01)
(52) U.S. Cl. .................. 257/292; 257/291; 257/293; 257/E27.131; 257/E27.132; 257/E27.133
(58) Field of Classification Search ......... 257/291–293; 438/70
See application file for complete search history.

(56) References Cited

U.S. PATENT DOCUMENTS

| 5,616,959 | A  | * | 4/1997 | Jeng ........................... 257/758 |
| 7,598,581 | B2 | * | 10/2009 | Lee et al. ..................... 257/435 |
| 2006/0199295 | A1 | * | 9/2006 | Hong et al. ................... 438/48 |
| 2007/0029463 | A1 | * | 2/2007 | Park et al. ................. 250/208.1 |
| 2008/0116537 | A1 | * | 5/2008 | Adkisson et al. ............ 257/448 |
| 2009/0065828 | A1 | * | 3/2009 | Hwang ....................... 257/292 |
| 2009/0200452 | A1 | * | 8/2009 | Venezia et al. ........... 250/208.1 |

FOREIGN PATENT DOCUMENTS

KR 731127 * 6/2007

* cited by examiner

*Primary Examiner*—A. Sefer
(74) *Attorney, Agent, or Firm*—Sherr & Vaughn, PLLC

(57) ABSTRACT

An image sensor and fabricating method thereof are disclosed by which damage to a protective layer can be prevented in a manner of reducing thermal stress of an uppermost metal line in performing thermal treatment for enhancing the dark characteristic. Such damage can be prevented by forming a poly layer pattern in an insulating interlayer on at least one side of the uppermost layer metal line.

21 Claims, 7 Drawing Sheets

Sensing Part — Peripheral driving part

IMAGE SENSOR AND FABRICATING METHOD THEREOF

The present application claims priority under 35 U.S.C. §119 to Korean Patent Application No. 10-2007-0117990 (filed on Nov. 19, 2007), which is hereby incorporated by reference in its entirety.

BACKGROUND

Generally, an image sensor is a semiconductor device that converts an optical image to an electric signal and can be categorized into a charge coupled device (CCD) and a CMOS image sensor (CIS). The CCD has a complicated driving mechanism, consumes a considerably power, and requires a multi-step photo process. Hence, the CCD has a disadvantage of a complicated fabricating process. Moreover, the CCD has difficulty in integrating a control circuit, a signal processing circuit, an analog/digital (A/D) converter and the like on and/or over a CCD chip, thereby being disadvantageous in downsizing a product.

As a next generation image sensor for overcoming the disadvantages of the CCD, attention has focused on the CIS. The CIS image sensor includes MOS transistors equal in number to the number of unit pixels. The CIS may be formed on and/or over a semiconductor substrate by CMOS technology that uses a control circuit, a signal processing circuit and the like as peripheral circuits. Thus, the CIS is the device adopting the switching system for sequentially detecting outputs of unit pixels by the MOS transistors, respectively. In particular, the CIS implements an image in a manner of forming a photodiode and a MOS transistor within a unit pixel and then sequentially detecting an electric signal of the corresponding unit pixel by switching. Since the CIS uses CMOS fabrication technology, it thereby has advantages of low power consumption, a simple fabricating method due to the reduced number of photo process steps and the like. Moreover, the CIS is able to integrate a controller, a signal processor, an A/D converter and the like on a CIS chip, thereby having advantage in downsizing a product. Therefore, the CIS is widely used for the various applied field of a digital still camera, a digital video camera and the like.

Figure 1:
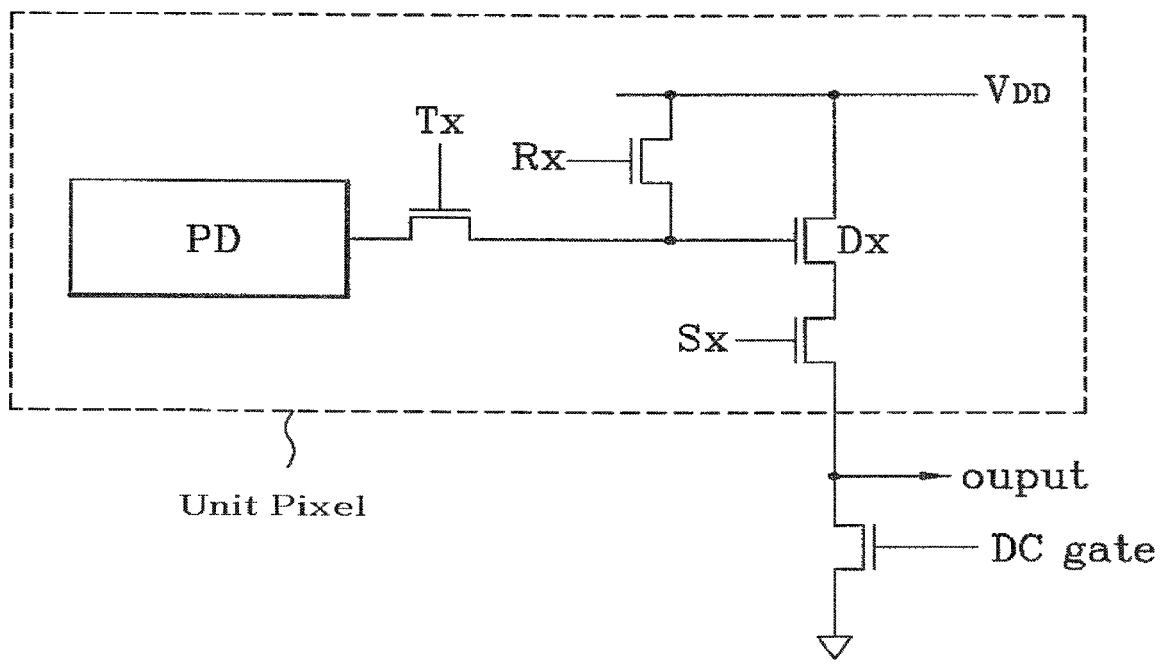

Example FIG. 1 is an equivalent circuit diagram of a unit pixel of a CIS that includes a single photodiode (PD) and four MOS transistors. A unit pixel of a CIS includes photodiode (PD) generating photocharges by receiving light, transfer transistor Tx transferring the photocharges collected in photodiode (PD) to floating diffusion region (FD), rest transistor Rx setting a potential of floating diffusion region (FD) to a specific value and resetting floating diffusion region (FD) by discharging electric charges, drive transistor Dx playing a role as a source follow buffer amplitude, and select transistor Sx playing a switching role to enable addressing. A load transistor is provided outside the unit pixel to enable an output signal to be read.

Figure 2:
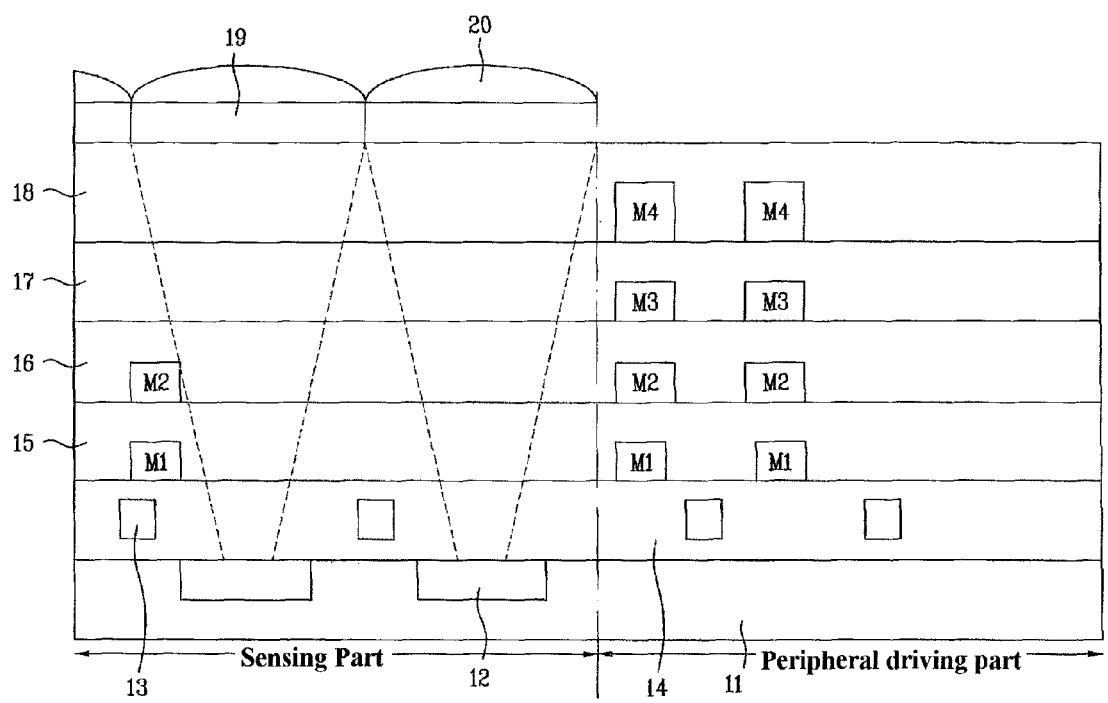

Example FIG. 2 is a cross-sectional diagram of the CIS illustrated in example FIG. 1. As illustrated in example FIG. 2, the CIS includes a field oxide layer formed on and/or over semiconductor substrate 11 defined into a sensing part and a driving part to define an active area, plurality of photodiodes 12 formed in the active area of semiconductor substrate 11, and plurality of transistors 13 formed on and/or over the active area of semiconductor substrate 11. First insulating interlayer 14 is formed on and/or over substrate 11 including the sensing part having photodiode 12 and transistor 13 and a peripheral driving part. First metal line M1 is formed on and/or over first insulating interlayer 14. Second insulating interlayer 15, second metal line M2, third insulating interlayer 16, third metal line M3, fourth insulating interlayer 17, fourth metal line M4 and protective layer 18 are sequentially formed on and/or over first metal line M1.

Contact holes and contact plugs are formed in insulating interlayers 14, 15, 16 and 17 between metal lines M1, M2, M3 and M4 to electrically connect metal lines M1, M2, M3 and M4, respectively. Second metal line M2, third metal line M3 and fourth metal line M4 are provided in the peripheral driving part, thereby not affecting light incident on and/or over photodiode 12. R/G/B color filter layer 19 is formed on and/or over protective layer 18 of the sensing part to implement a color image. An array of microlenses 20 is formed on and/or over and spatially corresponding to color filter layer 19. Microlens 20 obtains a specific curvature in a manner of coating photoresist, patterning the photoresist to remain on and/or over photodiode 12 only and then reflowing the photoresist by baking. Microlens 20 plays an important role in condensing an incident light on and/or over photodiode 12.

However, in the process for fabricating such a CIS, after protective layer 18 has been formed, before color filter layer 19 and microlens 20 are formed, thermal treatment is performed at a temperature of about 450° C. to enhance the dark characteristic. In particular, when a dark image is captured, a white dot-type can be generated. The cause of the white dot-type is explained as follows. First, the photodiode is formed by implanting impurity ions and an ion beam is used for an etch process for forming a thin film transistor or a metal line. The impurity ion implantation or the ion beam may charge a silicon substrate surface with electrons. If the surface is charged with the electrons, the white dot-type is generated on a black screen. This is called a dark defect. To settle the dark defect, after protective layer 18 has been formed, before color filter layer 19 and microlens 20 are formed, the thermal treatment is performed at the temperature of about 450° C. Through the thermal treatment, hydrogen atom of silane gas ($SiH_4$) used in depositing the insulating interlayer or the like pushes out to replace the charged electrons at the surface of the silicon substrate, whereby the dark characteristic is enhanced.

However, such a CIS fabricating method has the following problem. First, if the thermal treatment is performed to enhance the dark characteristic, thermal stress is generated from the metal line in the structure where the metal line, the insulating interlayer and the protective layer diffuse into a single layer to destroy the protective layer on and/or over the uppermost metal line. Therefore, the protective layer function for protecting devices is degraded or otherwise lost.

SUMMARY

Embodiments relate to an image sensor and a fabricating method thereof that it is particularly suitable for preventing a protective layer from being broken by thermal stress when performing a thermal process for enhancing a dark characteristic.

Embodiments relate to an image sensor and fabricating method thereof by which breaking of a protective layer can be prevented in a manner of reducing thermal stress of a metal line in performing thermal treatment for enhancing the dark characteristic by forming a poly layer within an insulating interlayer provided at both or one side of an uppermost layer metal line.

Embodiments relate to an image sensor that may include at least one of the following: a semiconductor substrate defined into a sensing part and a peripheral driving part; a plurality of photodiodes and transistors formed in the sensing part of the semiconductor substrate; an insulating layer formed on and/or over the semiconductor substrate; at least one lower insulating interlayer formed on and/or over the insulating layer; at least one lower metal line formed on and/or over the at least one insulating interlayer; an upper insulating interlayer formed on and/or over the substrate including the at least one metal line; an upper metal line formed on and/or over the upper insulating interlayer; a poly layer formed on and/or over the upper insulating interlayer on at least one side of the upper metal line; and a protective layer formed on and/or over the upper insulating interlayer including the poly layer and the upper metal line.

Embodiments relate to a method of fabricating an image sensor that may include at least one of the following: providing a semiconductor substrate defined into a sensing part and a peripheral driving part; and then forming a plurality of photodiodes and transistors in the sensing part of the semiconductor substrate; and then forming an insulating layer formed on and/or over the semiconductor substrate; and then forming at least one lower insulating interlayer on and/or over the insulating layer; and then forming at least one lower metal line on and/or over the at least one insulating interlayer; and then forming an upper insulating interlayer on and/or over the substrate including the at least one metal line; and then forming an upper metal line on and/or over the upper insulating interlayer; and then forming a poly layer on and/or over the upper insulating interlayer on at least one side of the upper metal line; and then forming a protective layer on and/or over the upper insulating interlayer including the poly layer and the upper metal line.

Embodiments relate to a method of fabricating an image sensor that may include at least one of the following: forming photodiodes in a semiconductor substrate; and then forming transistors over the semiconductor substrate including the photodiodes; and then forming an insulating layer over the semiconductor substrate including the photodiodes and the transistors; and then forming a lower insulating interlayer over the insulating layer; and then forming lower metal lines over the lower insulating interlayer; and then forming an upper insulating interlayer over lower insulating interlayer including the lower metal line; and then forming an upper metal line over the upper insulating interlayer; and then forming a trench in the upper insulating interlayer on both sides of the upper metal line; and then forming a polyimide-based polymer pattern in the trenches such that the uppermost surface of the upper insulating layer, the upper metal line and the poly layer are coplanar; and then forming a protective layer over the upper insulating interlayer including the polyimide-based polymer pattern and the upper metal line; and then performing a thermal treatment after forming the protective layer.

The image sensor in accordance with embodiments has the following effects and/or advantages. First, a poly layer is formed on at least one side of an upper metal line of an uppermost layer. Therefore, even if a thermal treatment process is performed to enhance the dark characteristic, the poly layer absorbs the thermal stresses of the uppermost metal line. Accordingly, prevention of damage or destruction of the protective layer can be established.

DRAWINGS

Example FIGS. 1 and 2 illustrate a circuit for a unit pixel of an image sensor and a cross-sectional diagram of an image sensor.

Figure 3:
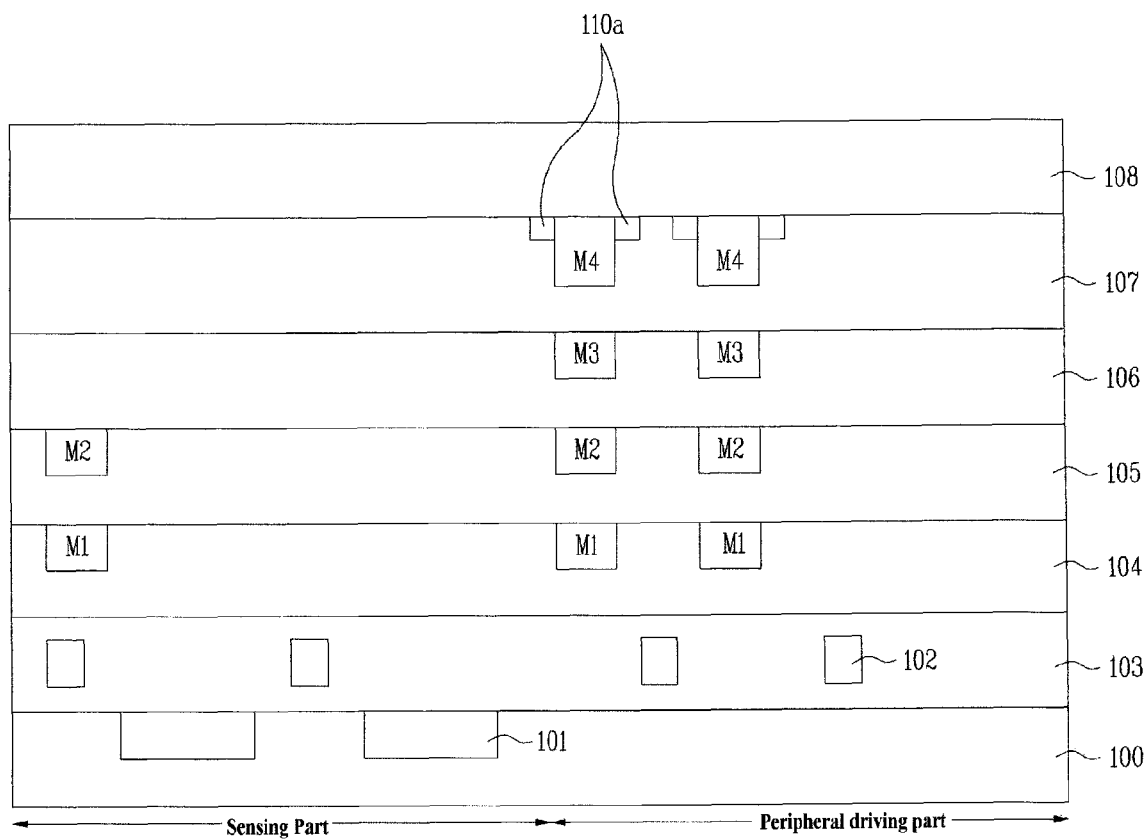

Example FIGS. 3 and 4 illustrate an image sensor and a method of fabricating an image sensor in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

As illustrated in example FIG. 3, an image sensor in accordance with embodiments includes semiconductor substrate 100 defined into a sensing part and a peripheral driving part. Plurality photodiodes 101 are formed in the sensing part of semiconductor substrate 100. Transistors 102 are formed in the sensing part and the peripheral driving part of substrate 100 and photodiodes 101. Insulating layer 103 is formed on and/or over semiconductor substrate 100 including photodiodes 101 and transistors 102. First insulating interlayer 104 is formed on and/or over insulating layer 103. First metal line M1 is provided in the sensing part and the peripheral driving part on and/or over first insulating interlayer 104. Second insulating interlayer 105 is formed on and/or over semiconductor substrate 100 including first metal line M1. Second metal line M2 is formed in the sensing part and the peripheral driving part on and/or over second insulating interlayer 105. Third insulating interlayer 106 is formed on and/or over semiconductor substrate 100 including second metal line M2. Third metal line M3 is formed in the peripheral driving part of semiconductor substrate 100 on and/or over third insulating interlayer 106. Fourth insulating interlayer 107 is formed on and/or over semiconductor substrate 100 including third metal line M3. Fourth metal line M4 is formed in the peripheral driving part of semiconductor substrate 100 on and/or over fourth insulating interlayer 107. Poly layer 110a is formed on at least one side of fourth metal line M4. Protective layer 108 is formed on and/or over fourth insulating interlayer 107 including fourth metal line M4 and poly layer 110a. Protective layer 108 includes an oxide layer.

Poly layer 110a may have a width and depth that is in a range between approximately 1/100 to 1/300 of those of fourth metal line M4. Poly layer 110a is formed of a polyimide-based polymer material. Metal lines M1, M2, M4 and M4 may be formed of one of Al, Cu, Mo, Ti, Ta and the like with a single layer or a stacked layer including at least two materials. Metal lines M1, M2, M4 and M4 may be formed by a dual damascene process for forming trenches and via contact holes in the respective insulating interlayers. Hence, metal layer are formed in the dual damscene structures. This will be explained in detail in the following description for a method of fabricating an image sensor.

As mentioned in the above description, in the image sensor in accordance with embodiments illustrated in FIG. 3, since poly layer 110a is provided at one or both sides of fourth metal line M4, even if thermal treatment is performed to enhance the dark characteristic after completion of protective layer 108, hillocks attributed to the thermal stress of metal line M4 can be directed to poly layer 110a. Therefore, it is able to prevent protective layer 108 from being broken or otherwise destroyed.

Example FIGS. 4A to 4F illustrate a method of fabricating an image sensor in accordance with embodiments.

Figure 4A:
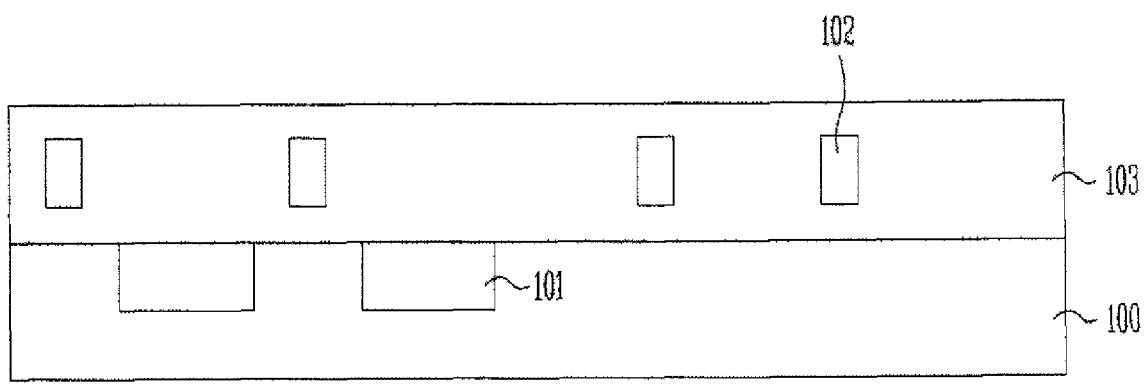

As illustrated in example FIG. 4A, a field oxide layer is formed on and/or over semiconductor substrate 100 defined into a sensing unit and a peripheral driving part to define the active area. Photodiodes 101 and transistors 102 are formed in the active area of semiconductor substrate 100. Insulating layer 103 is then formed on and/or over semiconductor substrate 100 including photodiodes 101 and transistors 102.

Figure 4B:
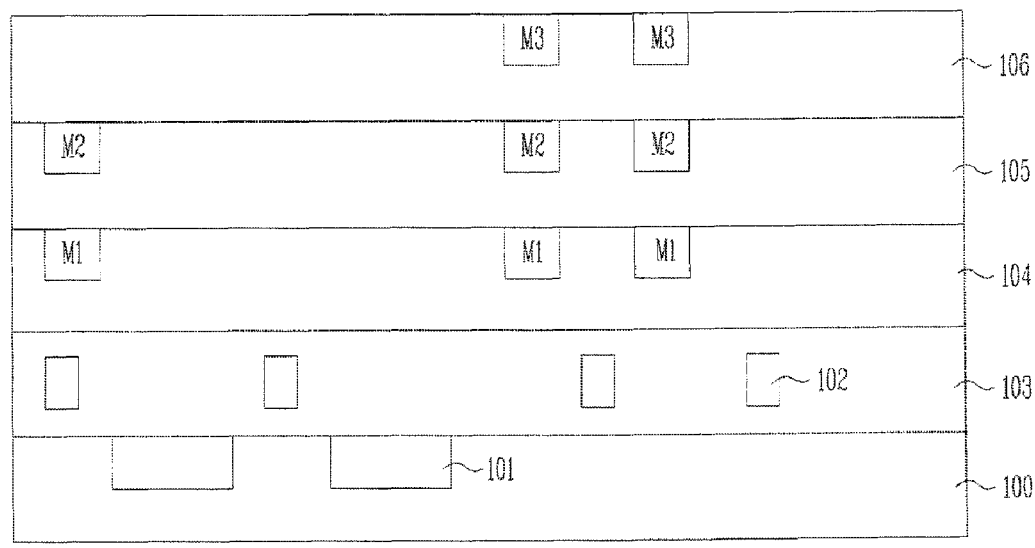

As illustrated in example FIG. 4B, first insulating interlayer 104 is then formed on and/or over insulating layer 103.

A portion of first insulating interlayer 104 for forming a metal line is then selectively removed by photolithography to form a trench in a dual damascene structure. A first metal layer is deposited on and/or over first insulating interlayer 104 to fill the trench. The first metal layer is then planarized by chemical mechanical polishing (CMP) until a surface of first insulating interlayer 104 is exposed, thereby forming first metal line M1 in the trench. Second insulating interlayer 105 is then formed on and/or over first insulating interlayer 104 including first metal line M1 using the same method of forming first metal line M1. Third insulating interlayer 106 is then formed on and/or over second insulating interlayer 105 including second metal line M2 using the same method explained in the above description.

Figure 4C:
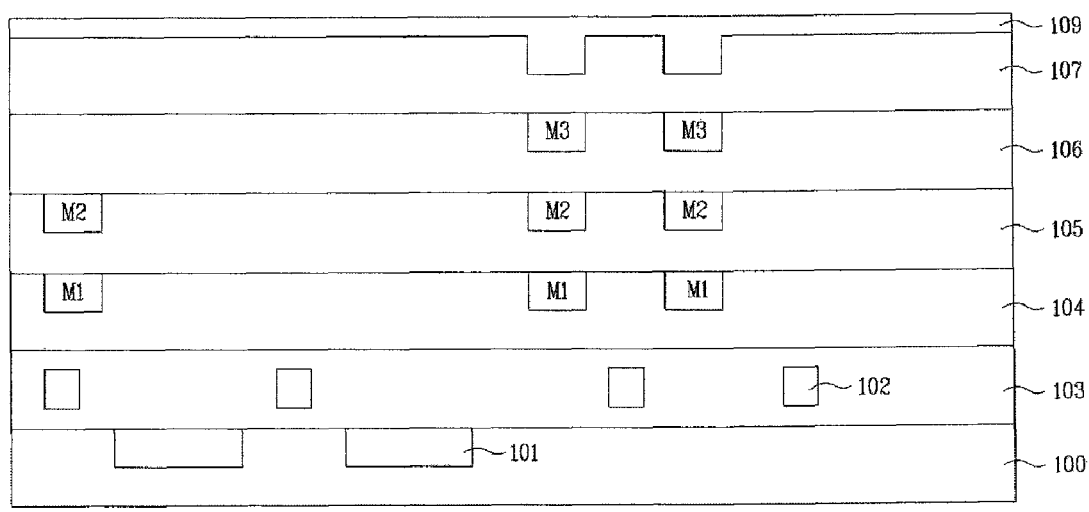

As illustrated in example FIG. 4C, fourth insulating interlayer 107 is then formed on and/or over third insulating interlayer 106 including third metal line M3. As mentioned in the foregoing description, by selectively removing a portion of fourth insulating interlayer 107 for forming a fourth metal line by photolithography, a trench in a dual damascene structure is formed. Metal layer 109 is deposited on and/or over fourth insulating interlayer 107 to fill the trench.

Figure 4D:
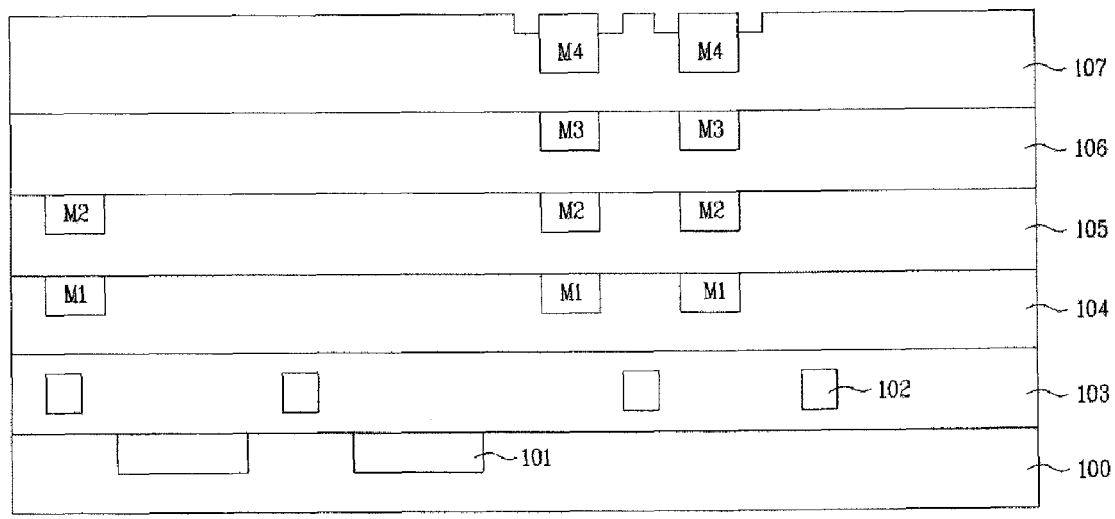

As illustrated in example FIG. 4D, a portion of metal layer 109 is removed by CMP until a surface of fourth insulating interlayer 107 is exposed, thereby forming fourth metal line M4 in the trench. A portion of fourth insulating interlayer 107 adjacent to at least one side of fourth metal line M4 is removed to a prescribed depth by photolithography to form a trench. A width and depth of the trench formed is in a range between approximately $1/100$ to $1/300$ of those of fourth metal line M4.

Figure 4E:
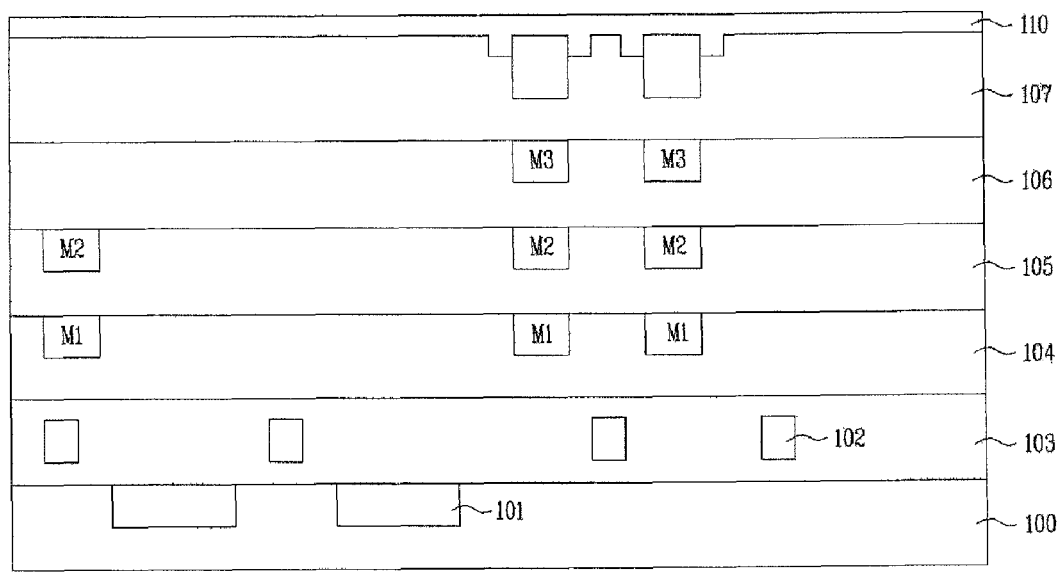

As illustrated in example FIG. 4E, poly layer 110 is then formed on and/or over fourth insulating interlayer 107 including fourth metal line M4 to fill the trench. Poly layer 110 is formed of a polyimide-based polymer substance.

Figure 4F:
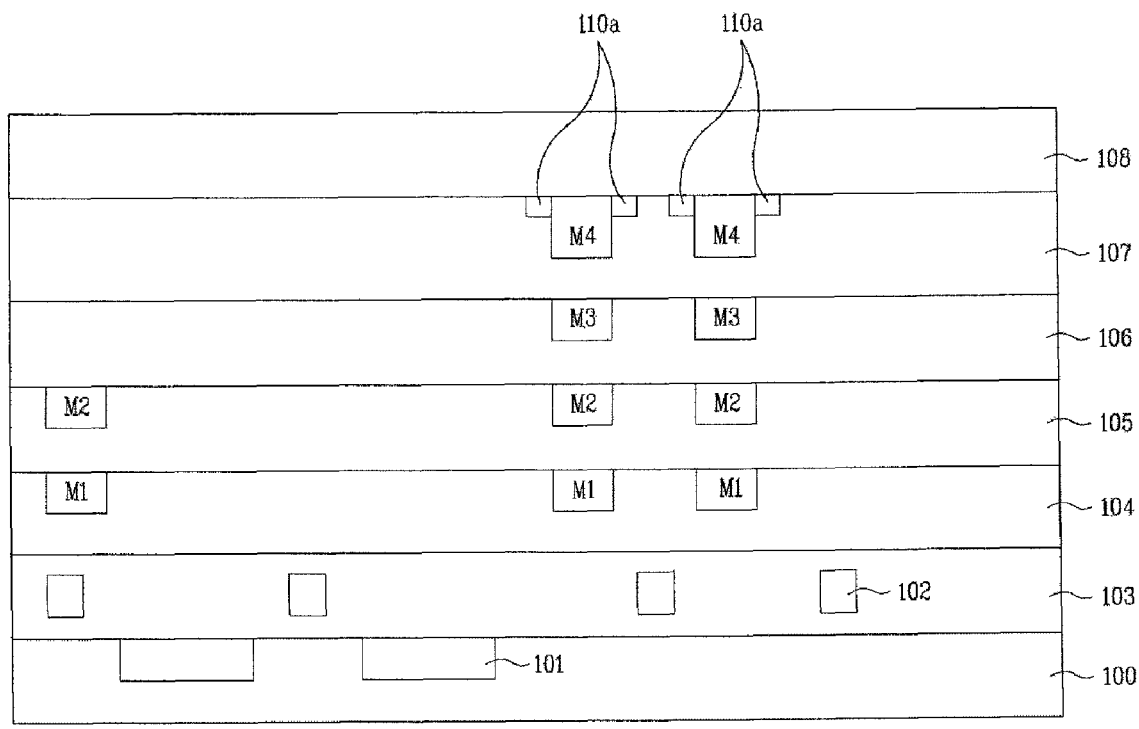

As illustrated in example FIG. 4F, poly layer pattern 110a is formed on at least one side of fourth metal line M4 by removing a portion of poly layer 110 by CMP until the surface of fourth insulating interlayer 107 and fourth metal line M4 are exposed. The uppermost surfaces of poly layer pattern 110a, fourth insulating interlayer 107 and fourth metal line M4 are coplanar. Protective layer 108 composed of an oxide is then formed on and/or over fourth insulating interlayer 107 including fourth metal line M4 and poly layer 110a. Each metal line is formed of one of Al, Cu, Mo, Ti, Ta and the like in a single layer or a multi-layer structure. Thereafter, thermal treatment is performed at a temperature in a range between approximately 350 to 450° C. to enhance the dark characteristic. Color filter layers for filtering light per wavelength are then formed on and/or over protective layer 108 corresponding spatially to photodiodes 101 of the sensing part to be evenly spaced apart from each other in a manner of patterning dyeable resist. A microlens substance layer is then coated on and/or over semiconductor substrate 100 including the color filter layers and then patterned by exposure and development to form a microlens array on and/or over and corresponding to the color filter layers.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a semiconductor substrate defined into a sensing part and a peripheral driving part;
   a plurality of photodiodes and transistors formed in the sensing part of the semiconductor substrate;
   an insulating layer formed over the semiconductor substrate including the photodiodes and the transistors;
   at least one lower insulating interlayer formed over the insulating layer;
   at least one lower metal line formed over the at least one insulating interlayer;
   an upper insulating interlayer formed over the semiconductor substrate including the at least one lower metal line;
   an upper metal line formed over the upper insulating interlayer;
   a poly layer formed over the upper insulating interlayer on at least one side of the upper metal line such that the uppermost surfaces of the upper insulating layer, the upper metal line and the poly layer are coplanar; and
   a protective layer formed over the upper insulating interlayer including the poly layer and the upper metal line.

2. The apparatus of claim 1, wherein the width and the depth of the poly layer is in a range between approximately $1/100$ to $1/300$ of the width and the depth of the upper metal line.

3. The apparatus of claim 1, wherein the poly layer is formed of a polyimide-based polymer.

4. The apparatus of claim 1, wherein the protective layer comprises an oxide layer.

5. The apparatus of claim 1, wherein each of the at least one lower metal line and the upper metal line is composed of one selected from the group consisting of Al, Cu, Mo, Ti, Ta.

6. The apparatus of claim 5, wherein each of the at least one lower metal line and the upper metal line is formed in a single layer.

7. The apparatus of claim 5, wherein each of the at least one lower metal line and the upper metal line is formed in a stacked layer.

8. A method comprising:
   providing a semiconductor substrate defined into a sensing part and a peripheral driving part; and then
   forming a plurality of photodiodes and transistors in the sensing part of the semiconductor substrate; and then
   forming an insulating layer over the semiconductor substrate including the photodiodes and the transistors; and then
   forming at least one lower insulating interlayer over the insulating layer; and then
   forming at least one lower metal line over the at least one insulating interlayer; and then
   forming an upper insulating interlayer over the semiconductor substrate including the at least one lower metal line; and then
   forming an upper metal line over the upper insulating interlayer; and then
   forming a poly layer over the upper insulating interlayer on at least one side of the upper metal line such that the uppermost surface of the upper insulating layer, the upper metal line and the poly layer are coplanar; and then
   forming a protective layer over the upper insulating interlayer including the poly layer and the upper metal line.

9. The method of claim 8, wherein the width and the depth of the poly layer is in a range between approximately 1/100 to 1/300 of the width and the depth of the upper metal line.

10. The method of claim 8, wherein the poly layer is formed of polyimide based polymer.

11. The method of claim 8, wherein the protective layer is formed of oxide.

12. The method of claim 8, wherein each of the at least one lower metal line and the upper metal line is composed of one selected from the group consisting of Al, Cu, Mo, Ti, Ta.

13. The method of claim 12, wherein each of the at least one lower metal line and the upper metal line is formed in a single layer.

14. The method of claim 12, wherein each of the at least one lower metal line and the upper metal line is formed in a stacked layer.

15. The method of claim 8, wherein forming the poly layer comprises:
   forming a trench in the upper insulating interlayer on at least one side of the upper metal line; and then
   depositing a polyimide-based polymer over the upper insulating interlayer to fill up the trench; and then
   performing chemical mechanical polishing on the polyimide-based polymer to expose the uppermost surface of the upper insulating interlayer and the upper metal line such that the polyimide-based polymer remains in the trench.

16. The method of claim 8, further comprising the step of performing a thermal treatment after forming the protective layer.

17. The method of claim 16, wherein the thermal treatment is performed at a temperature in a range between approximately 350 to 450° C.

18. The method of claim 8, further comprising, after forming the protective layer:
   forming a color filter layer over the protective layer corresponding spatially to the photodiodes; and then
   forming a microlens pattern over and corresponding spatially to the color filter layer.

19. A method comprising:
   forming photodiodes in a semiconductor substrate; and then
   forming transistors over the semiconductor substrate including the photodiodes; and then
   forming an insulating layer over the semiconductor substrate including the photodiodes and the transistors; and then
   forming a lower insulating interlayer over the insulating layer; and then
   forming lower metal lines over the lower insulating interlayer; and then
   forming an upper insulating interlayer over lower insulating interlayer including the lower metal line; and then
   forming an upper metal line over the upper insulating interlayer; and then
   forming a trench in the upper insulating interlayer on both sides of the upper metal line; and then
   forming a polyimide-based polymer pattern in the trenches such that the uppermost surface of the upper insulating layer, the upper metal line and the polyimide-based polymer pattern are coplanar; and then
   forming a protective layer over the upper insulating interlayer including the polyimide-based polymer pattern and the upper metal line; and then
   performing a thermal treatment after forming the protective layer.

20. The method of claim 19, wherein the protective layer is formed of oxide.

21. The method of claim 19, further comprising, after forming the protective layer:
   forming a color filter layer over the protective layer corresponding spatially to the photodiodes; and then
   forming a microlens pattern over and corresponding spatially to the color filter layer.

* * * * *